United States Patent
Chen et al.

(10) Patent No.: US 9,548,740 B1
(45) Date of Patent: Jan. 17, 2017

(54) MULTIPLE ALTERNATE CONFIGURATIONS FOR AN INTEGRATED CIRCUIT DEVICE

(71) Applicant: Altera Corporation, San Jose, CA (US)

(72) Inventors: Doris Tzu-Lang Chen, Toronto (CA); Deshanand Singh, Mississauga (CA)

(73) Assignee: Altera Corporation, San Jose, CA (US)

( * ) Notice: Subject to any disclaimer, the term of this patent is extended or adjusted under 35 U.S.C. 154(b) by 232 days.

(21) Appl. No.: 14/020,978

(22) Filed: Sep. 9, 2013

(51) Int. Cl.
  *H03K 19/177* (2006.01)
  *G06F 17/50* (2006.01)

(52) U.S. Cl.
  CPC ..... *H03K 19/17748* (2013.01); *G06F 17/5054* (2013.01)

(58) Field of Classification Search
  CPC .................. G05B 2219/23008; G05B 19/042; G06F 17/5022; G06F 15/7867; G06F 17/505; G06F 17/5054; G06F 11/362; G06F 2217/66; G06F 2217/86; G06F 8/445; G06F 8/447; G06F 8/48; G06F 8/49; G06F 9/54; H03K 19/17728; H03K 19/17704; H03K 19/1733; H03K 19/17736; H03K 19/1737; H03K 19/1776; H03K 19/17744
  USPC ...................................................... 326/37–50
  See application file for complete search history.

(56) References Cited

U.S. PATENT DOCUMENTS

| | | | |
|---|---|---|---|
| 2007/0283311 A1* | 12/2007 | Karoubalis | G06F 17/5054 326/38 |
| 2010/0153654 A1* | 6/2010 | Vorbach | G06F 12/0862 711/137 |
| 2011/0154012 A1* | 6/2011 | Kusmanoff et al. | 713/100 |

OTHER PUBLICATIONS

Chen, D. et al., "Profile-Guided Floating- to Fixed-Point Conversion for Hybrid FPGA-Processor Applications" *ACM Transactions on Architecture and Code Optimization (TACO)—Special Issue on High-Performance Embedded Architectures and Compilers*, vol. 9, Issue 4, Article No. 43, pp. 43:1-43:25 (Jan. 2013).

* cited by examiner

*Primary Examiner* — Alexander H Taningco
*Assistant Examiner* — Seokjin Kim
(74) *Attorney, Agent, or Firm* — Fletcher Yoder, P.C.

(57) ABSTRACT

A method of configuring an integrated circuit device to perform a function includes storing a plurality of configurations for performing the function, each of the configurations being designed for a different characteristic of a particular input to the function. Inputs are received for the function, including the particular input. The characteristic of the particular input as received is examined, and one of the plurality of configurations is instantiated based on that characteristic of the particular input as received. A machine-readable data storage medium may be encoded with instructions to perform the method. A programmable device may be configured according to the method, and also may be incorporated into a heterogeneous system.

26 Claims, 11 Drawing Sheets

US 9,548,740 B1

MULTIPLE ALTERNATE CONFIGURATIONS FOR AN INTEGRATED CIRCUIT DEVICE

FIELD OF THE INVENTION

This invention relates to the preparation of multiple alternate configurations for an integrated circuit device, and particularly for a programmable integrated circuit device such as a field-programmable gate array (FPGA) or other type of programmable logic device (PLD). More particularly, this invention relates to preparing such configurations for a programmable integrated circuit device in a larger heterogeneous systems.

BACKGROUND OF THE INVENTION

Early programmable devices were one-time configurable. For example, configuration may have been achieved by "blowing"—i.e., opening—fusible links. Alternatively, the configuration may have been stored in a programmable read-only memory. Those devices generally provided the user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable devices incorporating static random access memory (SRAM) elements for configuration became available. These devices, which also can be reconfigured, store their configuration in a nonvolatile memory such as an EPROM, from which the configuration is loaded into the SRAM elements when the device is powered up. These devices generally provide the user with the ability to configure the devices for look-up-table-type logic operations.

At some point, such devices began to be provided with embedded blocks of random access memory that could be configured by the user to act as random access memory, read-only memory, or logic (such as P-TERM logic). Moreover, as programmable devices have become larger, it has become more common to add dedicated circuits on the programmable devices for various commonly-used functions. Such dedicated circuits could include phase-locked loops or delay-locked loops for clock generation, as well as various circuits for various mathematical operations such as addition or multiplication. This spares users from having to create equivalent circuits by configuring the available general-purpose programmable logic.

While it may have been possible to configure the earliest programmable logic devices manually, simply by determining mentally where various elements should be laid out, it was common even in connection with such earlier devices to provide programming software that allowed a user to lay out logic as desired and then translate that logic into a configuration for the programmable device. With current larger devices, including those with the aforementioned dedicated circuitry, it would be impractical to attempt to lay out the logic without such software. Such software also now commonly includes pre-defined functions, commonly referred to as "cores," for configuring certain commonly-used structures, and particularly for configuring circuits for mathematical operations incorporating the aforementioned dedicated circuits. For example, cores may be provided for various trigonometric or algebraic functions.

Available programming software has heretofore assumed that when a user specifies a certain logic design, that design is static. However, in some cases, it may be that the design includes a function that is parameterizable or that may operate differently when its inputs are in different ranges. This is particularly the case where the programmable device is part of a larger heterogeneous system where some other device, such as a microprocessor, calls upon the programmable device to process data. Depending on the characteristics of those data, slightly different versions of the user logic design may be required.

SUMMARY OF THE INVENTION

A programming method and software may be provided that can accommodate user logic designs that may call for different configurations for different possible user data to be processed. One type of such a design may be used when the function to be programmed or configured may be parameterizable. Another type of such a design may be used when the function to be programmed or configured may operate differently for different ranges of input data.

According to such a method, a "library" of different hardware configurations may be created for each of those functions in a user logic design that may operate differently for different parameters or data ranges, so that a more efficient configuration can be instantiated at runtime when the input parameters and data are known. Although this process may be characterized loosely as being "speculative," in that configurations are created that may never, or rarely, be used, any "speculative" behavior may be intelligent or educated.

For example, the user may be asked to provide an expected range of values of the expected input data for the function to be implemented, or the expected sets of parameters if the function is parameterizable. Thus, the process usually would not involve haphazard guesswork in selecting the various configurations to be created.

The process may also include the creation, along with the various configurations based on the expected inputs, of a generic configuration that can handle a full range of possible inputs. However, such a configuration normally can be expected to consume larger amounts of device resources, and therefore would be expected to be selected at runtime only in a small portion of cases, if the other members of the library of "speculative" configurations were properly selected.

The creation of a heterogeneous system as described above, including the library of speculative configurations, as well as the specification of which members of the library should be instantiated in a particular runtime situation, can advantageously be carried out using a high-level programming language, rather than a hardware description language. One high-level programming language that may be adopted for specifying circuitry of an integrated circuit device, such as for configuring a programmable device, is OpenCL (Open Computing Language), although use of other high-level languages, and particularly other high-level synthesis languages, including OpenMP (Open Multi-Processing), OpenACC (Open Accelerator) C, C++, Fortran, C#, F#, BlueSpec and Matlab, also is within the scope of this invention. Nevertheless, the present invention is not limited to high-level programming languages.

In accordance with the present invention there is provided a method of configuring an integrated circuit device to perform a function. The method includes storing a plurality of configurations for performing the function, each of the configurations being designed for a different characteristic of a particular input to the function. Inputs are received for the function, including the particular input. The characteristic of the particular input as received is examined, and one of the plurality of configurations is instantiated based on that characteristic of the particular input as received.

A machine-readable data storage medium encoded with instructions to perform the method also is provided, as is a programmable device configured according to the method, as well as a system incorporating such a device.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which.

DETAILED DESCRIPTION OF THE INVENTION

Figure 1:
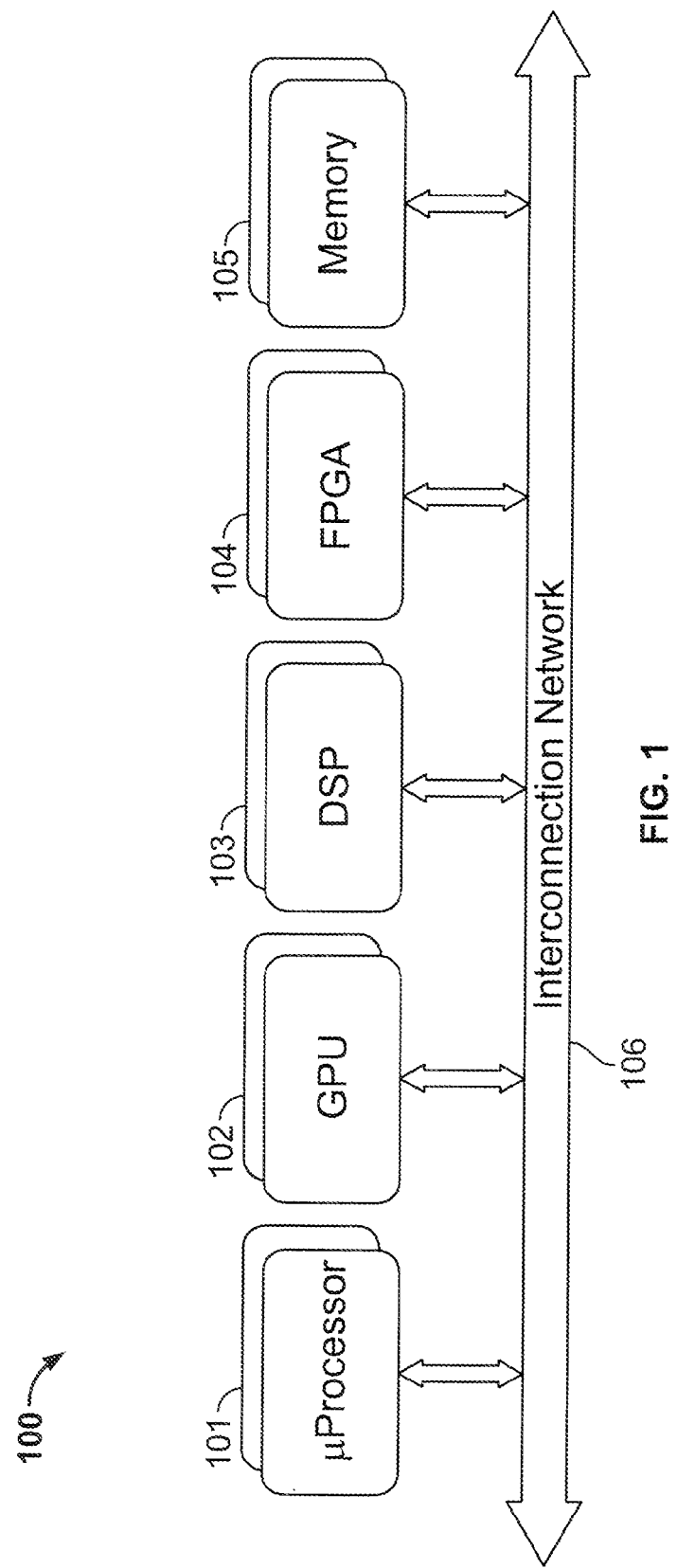
FIG. 1 shows a heterogeneous system with which the present invention may be used.

Synthesis of software code for an FPGA or similar programmable device involves transforming a software function into a hardware circuit. In a heterogeneous system, an FPGA may be used to provide hardware acceleration for certain functions that are less efficiently performed by a microprocessor. Thus, in such a system, the microprocessor will pass the function to the FPGA or other programmable device while it performs other functions for which it is better suited. The function passed to the programmable device may be parameterized, and the most efficient circuit to perform that function may differ depending on the parameters. Similarly, the function passed to the programmable device may be simpler for certain ranges of inputs and more complex for other ranges of inputs, so the most efficient circuit to perform that function may differ depending on the range of the input data.

When configuring a programmable device in such a system to perform such a function, one solution could be to configure the function in its most generic form, so that it can execute regardless of the parameters or the range of values. However, that may result in an unnecessarily large circuit configuration, consuming more device area than necessary and operating more slowly than might be possible if a smaller configuration could be instantiated.

By the time the rest of the heterogeneous system needs the programmable device to perform a particular function, the nature of the function to be performed is more well-defined. Thus, the parameters (if the function is parameterized) and the data values are known. However, one cannot wait until that moment to compile the programmable device configuration. Thus, in accordance with embodiments of the present invention, various configurations of the function to be performed are compiled in advance, and the correct one of those configurations, based on the parameters and/or the data, is instantiated in the programmable device at runtime.

The determination of which configurations to compile in advance may be assisted by accepting input from the user, at the time the system to be compiled is specified to the programming software, which specifies the likely different sets of parameters and/or ranges of data values that can be expected at runtime. In some cases, the user may be able to specify with certainty that only certain configurations will be needed. In other cases, the user may be able to specify ranges of inputs with sufficient certainty for the system to select specific configurations that may be needed. In still other cases, it may not be possible to limit the number of configurations with certainty, and in those cases, along with the specified configurations, a generic configuration also may be compiled, and indeed, the generic configuration may be compiled in most cases.

The precompilation of the possible configurations may allow the selection of the programmable device hardware to be included in the heterogeneous system to be limited to a device size that will support the largest precompiled configuration. Even in a case where precompilation of a generic configuration is still needed, it may be possible, if more than one programmable device is included in the heterogeneous system, to provide a mix of larger and smaller programmable devices, rather than providing all of the programmable devices in the largest size that might be expected to be needed.

Embodiments of the invention will now be described with reference to FIGS. 1-9.

FIG. 1 shows an example of a heterogeneous system 100, which includes one or more microprocessors 101, one or more graphics processing units 102, one or more digital signal processing units 103, one or more FPGAs 104 (or similar programmable devices), and one or more memory units 105, all interconnected by an interconnection network or bus 106. System 100 may be constructed as a set of interconnected discrete components, or as an SoC or "system-on-chip" on a single integrated circuit device.

As is known, each component in heterogeneous system 100 may be particularly well suited to a different function. For example, microprocessor 101 may be best suited for general-purpose irregular control applications, graphics processing units 102 may be best suited for floating-point vector computations on large datasets, digital signal processing units 103 may be best suited for highly flexible signal processing algorithms, while FPGAs 104 may be best suited for high-performance datapath and control functions.

Thus, there may be times during operation of system 100 that a microprocessor 101 would have to call on an FPGA 104 to perform a function. When system 101 is constructed, it may be known that that type of function will be required, but the particulars are not known, and therefore multiple configurations of the function will be precompiled as discussed above.

For example, if a Finite Impulse Response (FIR) filter will be required, that FIR filter function may be passed to FPGA 104 by microprocessor 101, in a high-level language (such as OpenCL), with three parameters, representing an input address "in", an output address "out", and the number of taps, n, in the filter:

```
int main( . . . ) {
   #pragma accel fpga
   fir(in,out,n);
   . . .
      return 0;
}
```

Figure 2:
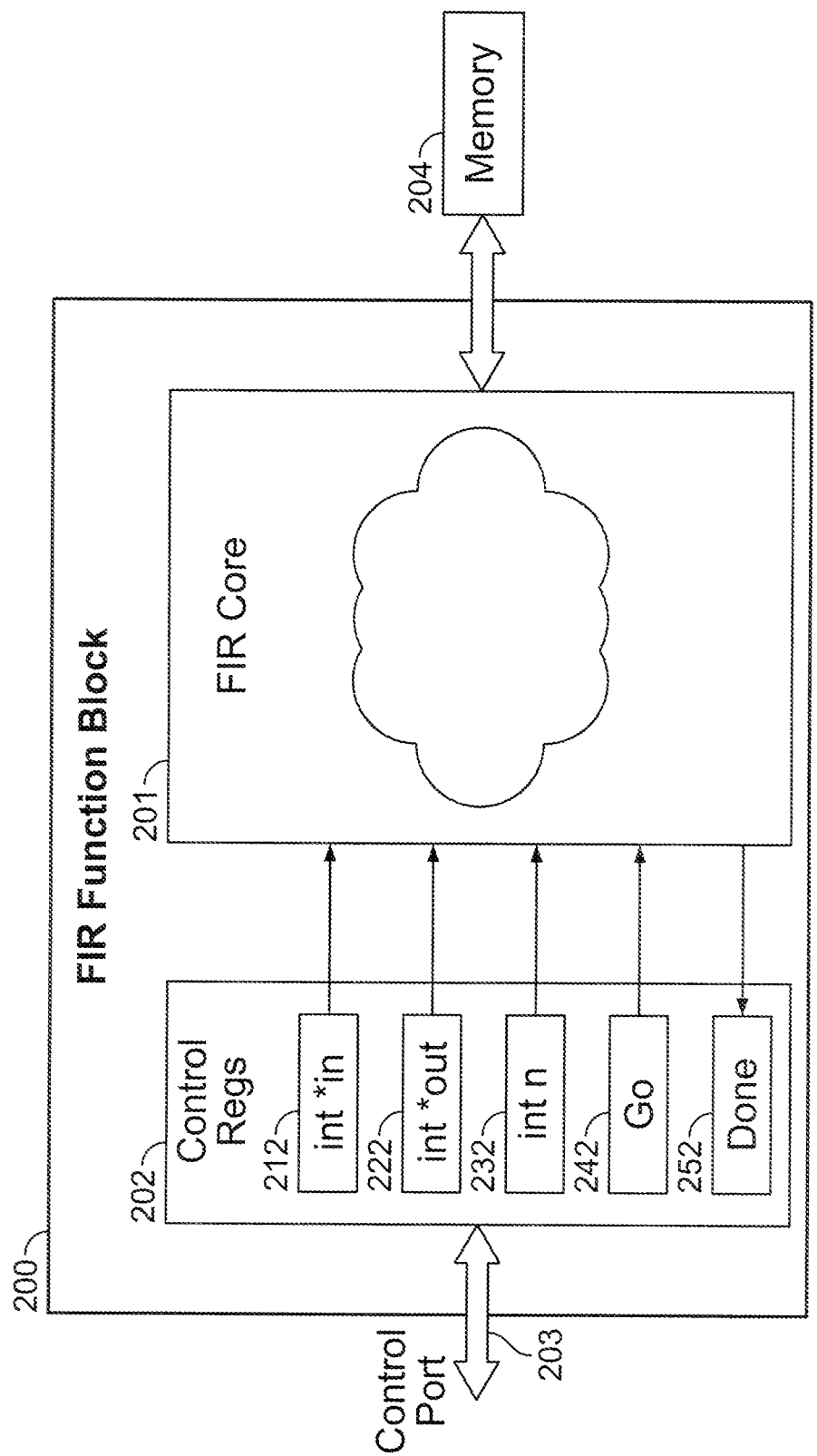
FIG. 2 shows an example of a function block that may be configured in a programmable device.

Using known techniques, the function would be implemented as shown in FIG. 2. FIR filter function block 200 includes a functional core 201, as well as a bank 202 of control registers. Registers 212, 222, 232 would receive the three parameters through control port 203. Register 212 would receive the input address which tells core 201 where in memory 204 to find the input data. Register 222 would receive the output address which tells core 201 where in memory 204 to write the output data. Register 232 would receive the variable indicating the number of taps required in the filter to be implemented in core 201. Later, a '1' would be written to "Go" register 242 to tell the filter to begin processing data, and when the filter would finish, it would write a '1' to "Done" register 252.

For FIR filter function block 200 to work, functional core 201 would have to capable of operating at the maximum possible number of expected taps, n. If that maximum possible number occurs in only a small fraction of cases, then providing a functional core 201 to account for the maximum possible number results in an inefficient circuit.

Figure 3:
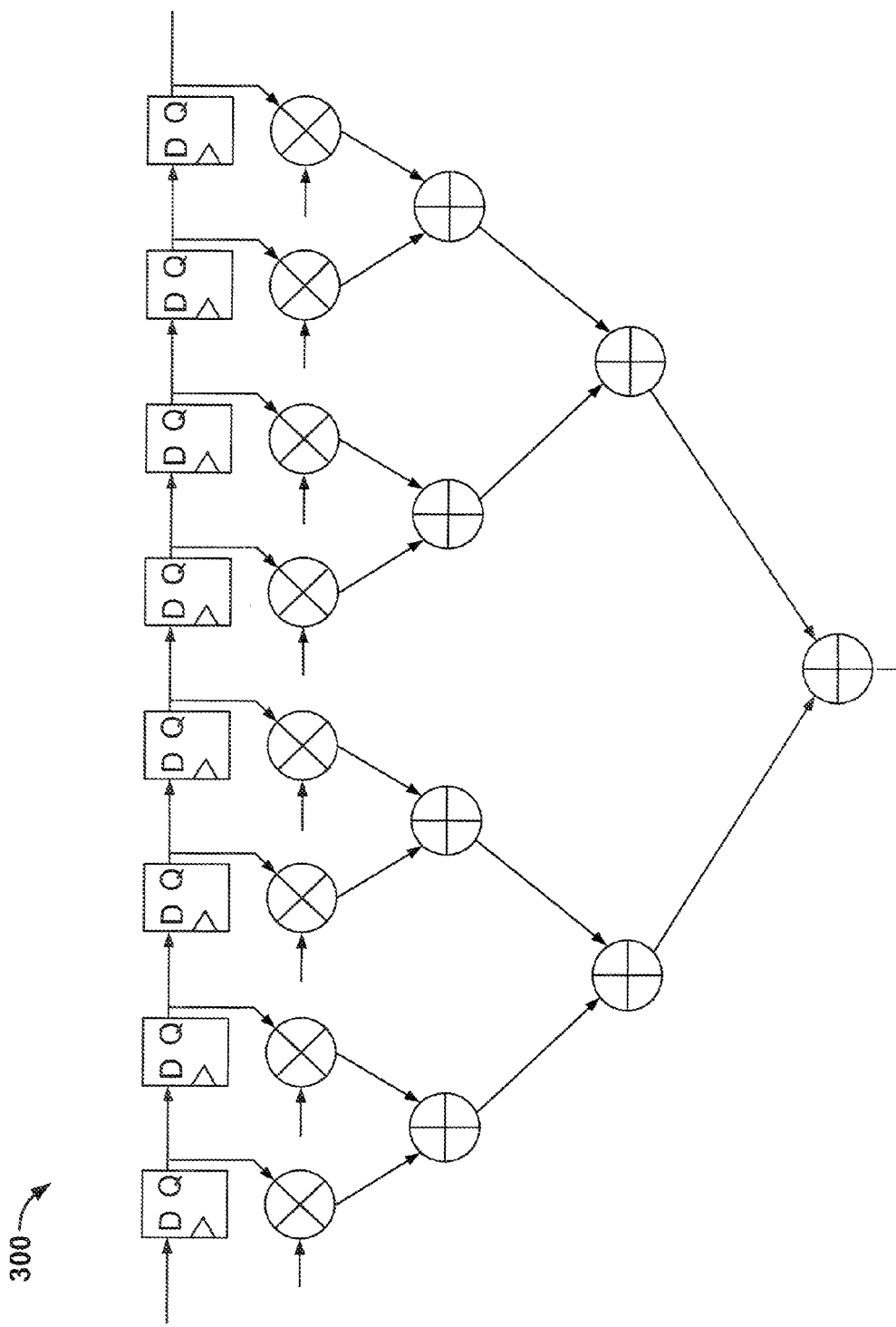
FIG. 3 shows a particular implementation of the function block of FIG. 2 for a known parameter.
Figure 4:
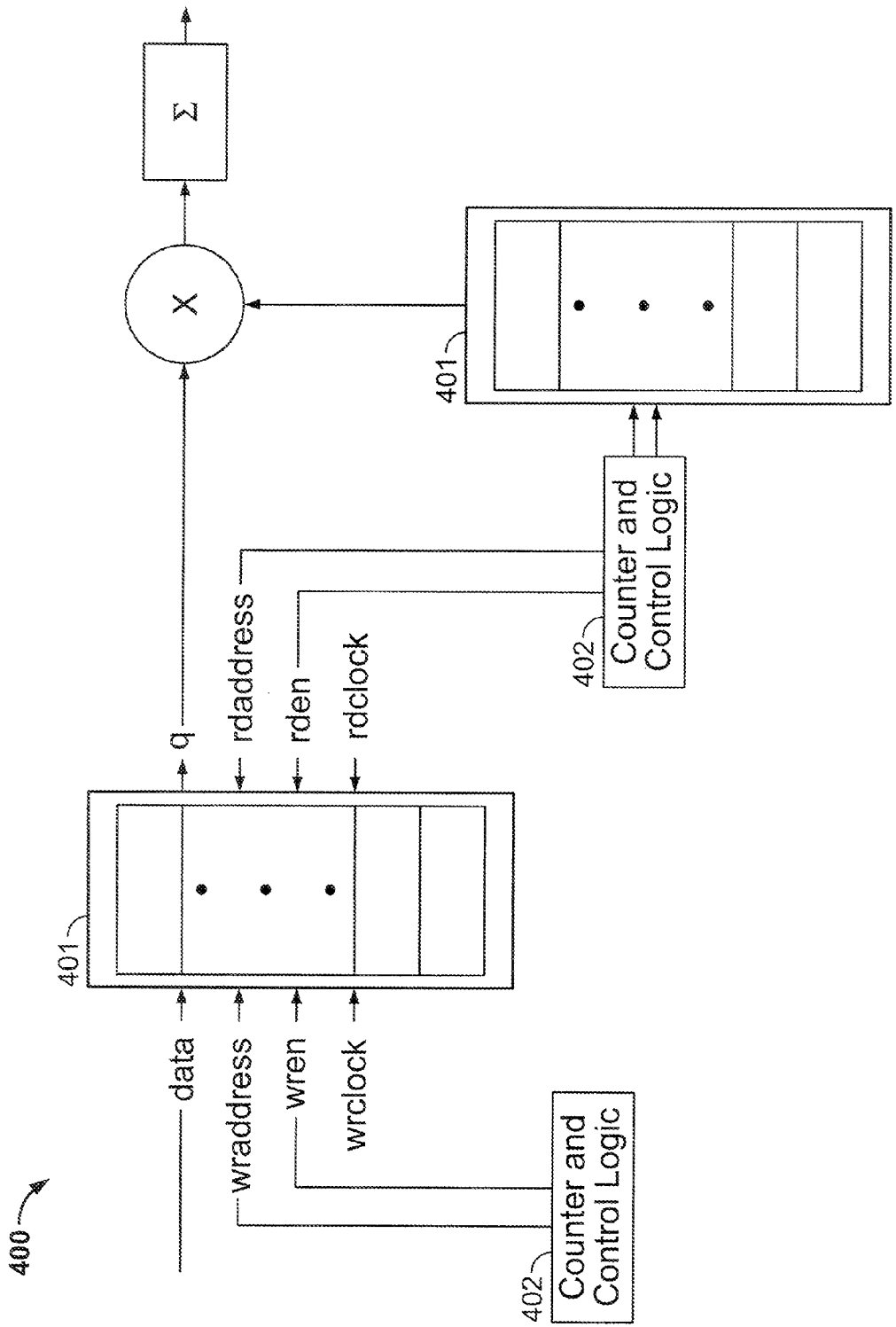
FIG. 4 shows a particular implementation of the function block of FIG. 2 for an arbitrary parameter.

For a constant, relatively small number of taps, n—e.g., 8 taps—one can compile a very efficient circuit such as circuit 300 of FIG. 3. At the other extreme would be circuit 400 of FIG. 4, which can accommodate an arbitrary number of taps, n, subject to limitations of available memories 401, and requiring complex counter-and-control-logic circuitry 402. Circuit 400 is not only less efficient than circuit 300—e.g., in terms of device area—but it also may execute more slowly, even for the same number of taps.

However, in accordance with embodiments of the invention, rather than compiling a single arbitrarily-sized FIR filter circuit, one can compile a number of FIR filter circuits designed for different numbers of taps. For example, if the number of taps can be 4 or 8, two different FIR filter circuits can be compiled—one 4-tap filter and one 8-tap filter—and the correct bitstream (i.e., to instantiate a 4-tap filter or an 8-tap filter) can be loaded by microprocessor 101 to instantiate the needed circuit. Even if there remained the possibility of other numbers of taps, so that an arbitrarily-sized FIR filter circuit also had to be compiled, that bitstream would not be loaded unless that case occurred, so there would be no waste of device resources for the smaller filters that were individually compiled. The various precompiled circuits or configurations can be stored in a memory 105 of heterogeneous system 100, or in a memory 140 within FPGA 104 (see FIG. 13)

In such a case, the function, set forth above, that would be passed from microprocessor 101 to FPGA 104 would be transformed, in a high-level language (such as OpenCL), to:

```
int main( . . . ) {
   . . .
   // Reprogram FPGA
   if (N==4) {
      download_fpga_bitstream(fir.4.bitstream);
   } else if (N==8) {
      download_fpga_bitstream(fir.8.bitstream);
   } else {
      download_fpga_bitstream(fir.N.bitstream);
   }
   // Set parameters
   io_write(FIR_CONTROL_PORT+0, &in[0]);
   io_write(FIR_CONTROL_PORT+1, &out[0]);
   io_write(FIR_CONTROL_PORT+2, n);
   // Set Go bit
```

Figure 5:
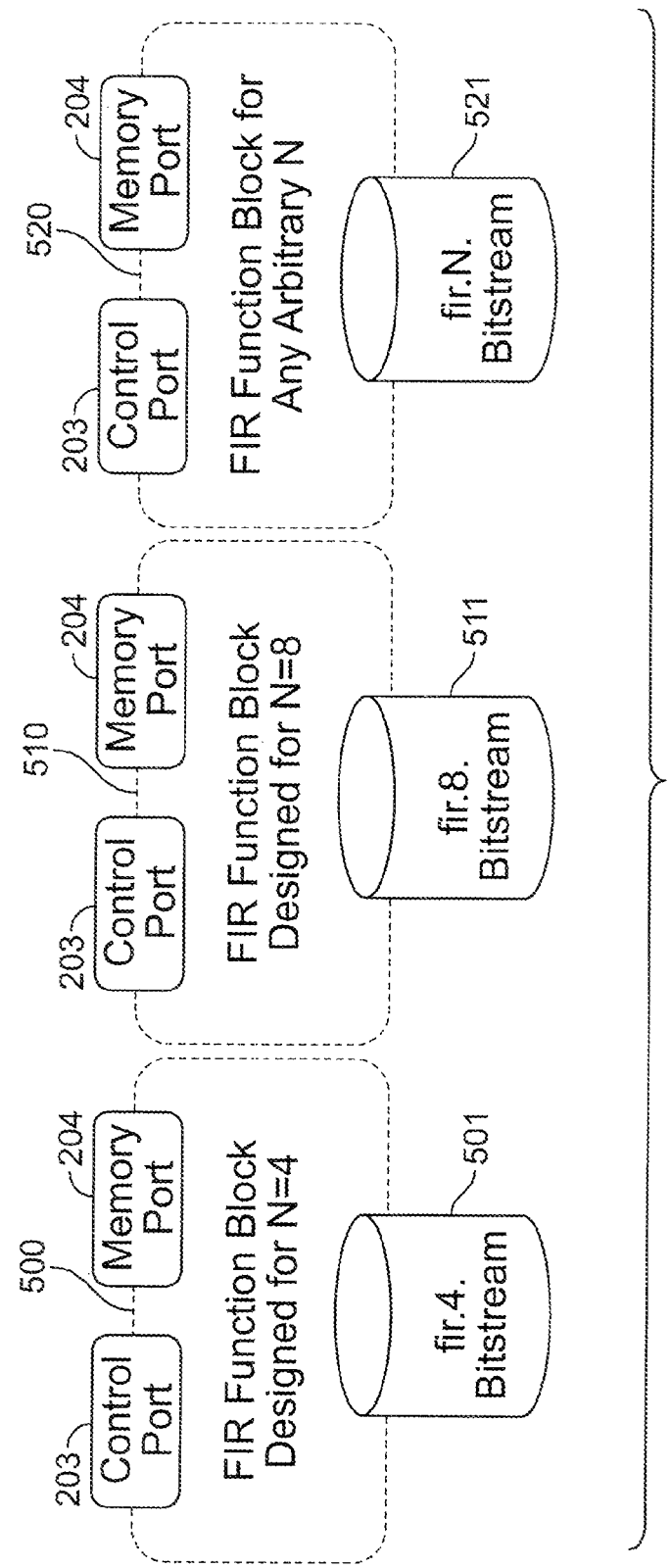
FIG. 5 shows three alternative implementations of the function block of FIG. 2 for different parameters.
Figure 6:
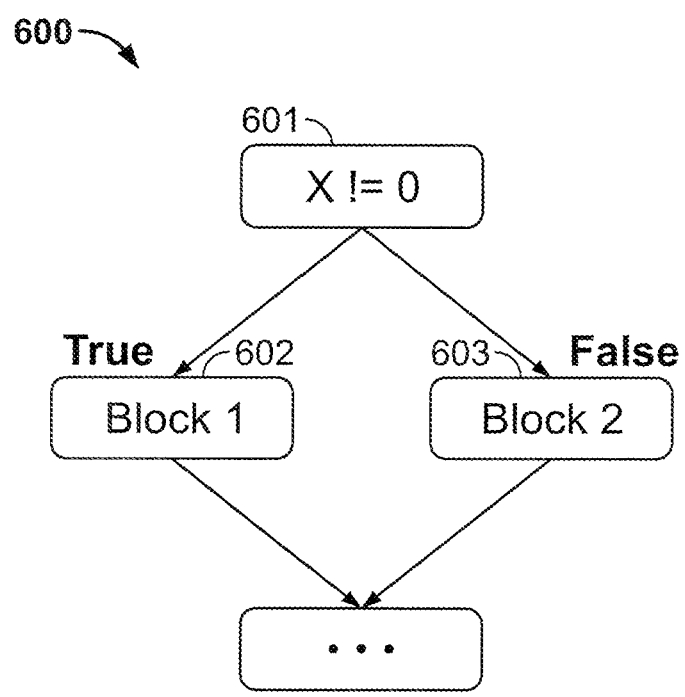
FIG. 6 shows a control flow graph of at least a portion of a function to be implemented in another example of a function block that may be configured in a programmable device.

The result of that function would be to instantiate one of the three blocks shown in FIG. 5. If N=4, fir.4.bitstream 501 would be downloaded, resulting in instantiation of a FIR function block 500 designed for N=4. If N=8, fir.4.bitstream 511 would be downloaded, resulting in instantiation of a FIR function block 510 designed for N=8. If the value of N were anything other than 4 or 8, fir.N.bitstream 521 would be downloaded, resulting in instantiation of a FIR function block 520 for arbitrary N (one would normally endeavor to create the most efficient possible such block).

More generally, in a heterogeneous system, which may use a high-level language such as OpenCL, when microprocessor 101 requires a function that is more efficiently performed in FPGA 104, it can call FPGA 104 as an accelerator to perform the function. Microprocessor 101 could configure an unconfigured FPGA 104 with the function, but that may be too time-consuming. Therefore, FPGA 104 may initially be at least partly configured with a version of the function, and microprocessor 101 would then reconfigure, or partially reconfigure, FPGA 104 with the desired version of the function.

A number of techniques may be used to determine which possible "speculative" functions to create.

For example, one technique to determine which possible "speculative" functions to create would be to examine the flow control graphs (see flow control graph 600 in FIG. 6) of the processes to be run by heterogeneous system 100, with each branch decision resulting in two "speculative" functions to be compiled—one function 602 for when the branch condition 601 is 'true' and one function 603 for when the branch condition 601 is 'false'. To reduce the number of functions required, branch conversion, as described in copending, commonly-assigned U.S. patent application Ser. No. 13/923,975, filed Jun. 21, 2013, which is hereby incorporated by reference herein in its entirety, could be used.

Another example of a technique to determine which possible "speculative" functions to create would be to examine loop bounds in the processes to be run by heterogeneous system 100. For example, if a loop bound is a variable, rather than a constant (e.g., "for i=1 to x), the loop can be unrolled, creating versions for different values of x up to some reasonable number. An arbitrary version (not unrolled) for larger x would likely also be created, unless the maximum value of x were known to be limited.

For certain types of functions, the expected range of input values might be used to determine which "speculative" functions to create. Floating-point arithmetic functions consume significant resources. For example, in an FPGA, a floating-point adder may consume about 21 times the amount of resources as an integer or fixed-point adder. However, for certain input values, fixed-point operations or range-reduced operations may produce results of equivalent accuracy to the floating-point operation. Therefore, if the expected input values for a floating-point operation are known, it may be possible to configure instead a fixed-point operation designed for those input values to provide as good a result, at less cost, than the original floating-point operation.

Therefore, in accordance with other embodiments of the invention, for a floating-point operation to be configured, two additional variables may be introduced, representing the upper and lower bounds of the expected input to the floating-point operation. These could be specified by the user, or deduced from the nature of the operation, or, during compilation, any floating-point operation could be identified by the compiler which could then ask the user to provide the upper and lower bounds of the input. The floating-point operation could then be implemented as a suitably designed fixed-point operation. This technique may be referred to as "value profiling."

Figure 7:
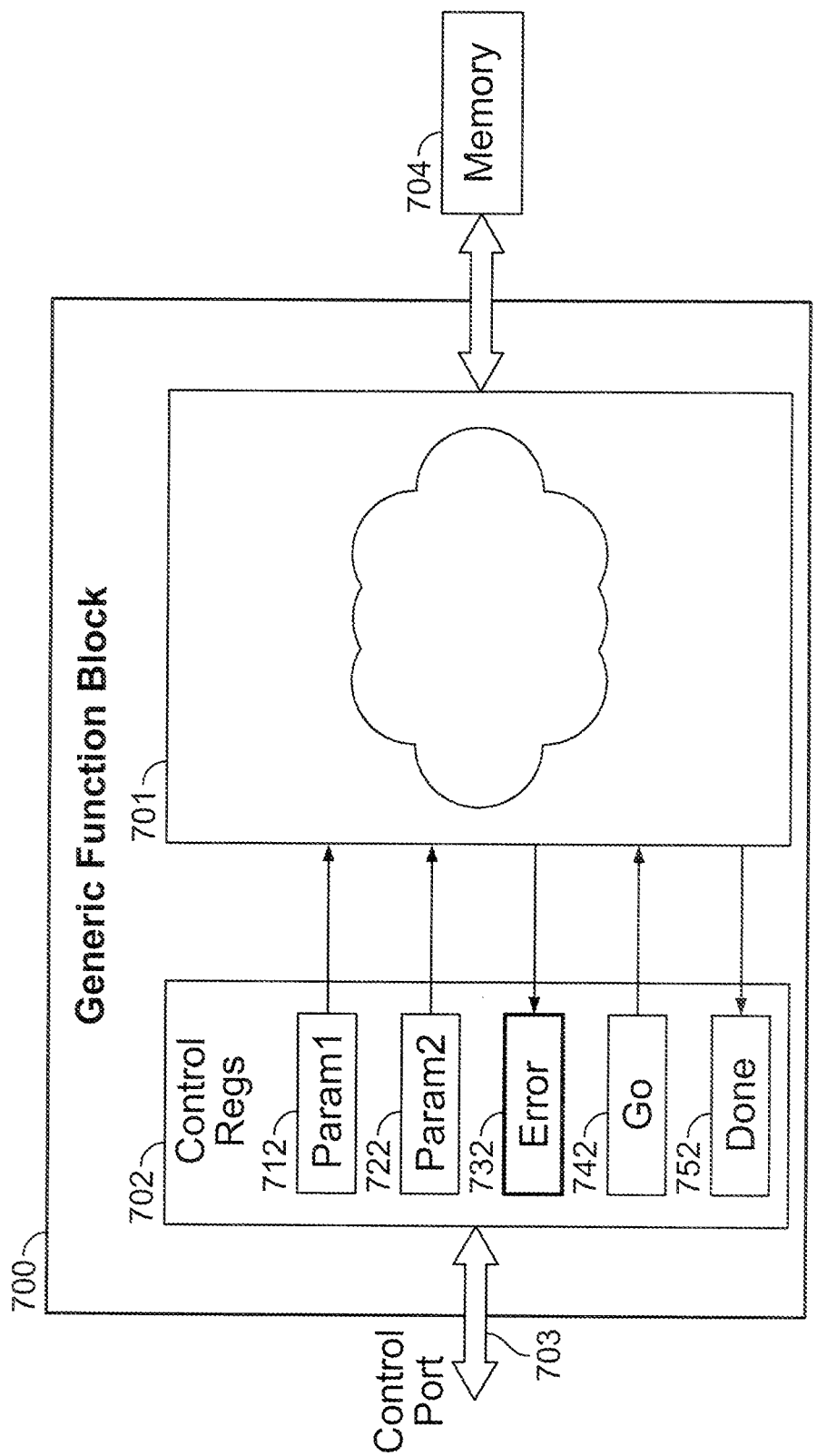
FIG. 7 shows an example of a function block, similar to that of FIG. 2, for implementing a floating-point arithmetic function.

A function block 700 that could be compiled for such an operation is shown in FIG. 7, and is similar to FIR filter function block 200 of FIG. 2. Function block 700 includes a functional core 701, as well as a bank 702 of control registers. Registers 712, 722 would receive the two parameters Param1 and Param2 indicating the range of expected input values through control port 703. Later, a '1' would be written to "Go" register 742 to tell functional core 702 to begin processing data, and when functional core 702 would finish, it would write a '1' to "Done" register 752. In this case, register 732 would function as an error register. A flag (e.g., a '1') could be written to register 732 in the event that an input value were received that was outside the bounds defined by Param1 and Param2. Microprocessor 101 would thus be alerted that it had to do something different.

One option for microprocessor 101 in such a case would be to fall back to a less-efficient configuration for the full floating-point version of the function, which could be compiled "speculatively" along with the more efficiently designed fixed-point version. In such a case, the function, set forth above, that would be passed from microprocessor 101 to FPGA 104 would be transformed, in a high-level language (such as OpenCL), to:

```
int main( ... ) {
    ...
    // Reprogram FPGA
    download_fpga_bitstream(f.FIXED.bitstream);
    // Set parameters
    ...
    // Set Go bit
    ...
    // Wait for HW to finish
    ...
    // Check for Value Range Error
    if (io_read(FIR_CONTROL_PORT+2)==1) {
        // Rerun with FLOATING POINT impl
        download_fpga_bitstream(f.FLOATING.bitstream);
        // Set parameters
    }
```

Figure 8:
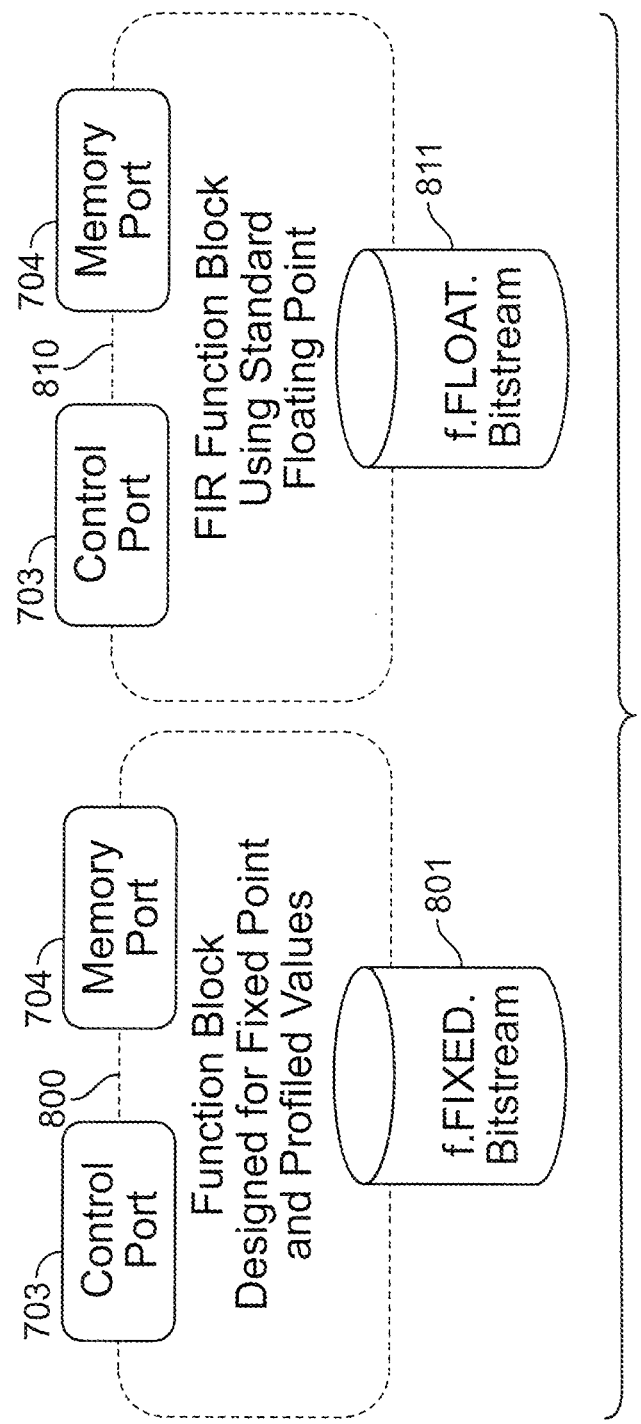
FIG. 8 shows two alternative implementations of the function block of FIG. 7 for different parameters.

The result of that function would be to instantiate one of the two blocks shown in FIG. 8. First, f.FIXED.bistream 801 would be loaded into the programmable device, resulting in instantiation of a fixed-point function block 800 designed for the range of values that was provided. If during operation of block 800 an input is encountered outside that range, an error flag (e.g., a '1') would be set in register 732. This would signal to microprocessor 101 that f.FLOAT.bistream 811 would be loaded into the programmable device, resulting in instantiation of a floating-point function block 810 capable of handling arbitrary inputs (one would normally endeavor to create the most efficient possible such block).

In another variant (not shown) of value profiling, the system might have precompiled one or more additional fixed-point blocks designed for different ranges of inputs outside the range specified based on user inputs, and before loading the full floating-point block, one might try those one or more fixed-point block, in order, until no error signal is generated or until the full floating-point block is reached.

In still another variant (not shown) of value profiling, the system might have precompiled one or more additional fixed-point blocks designed for different ranges of inputs outside the range specified based on user inputs. However, instead of providing a purely binary (i.e., '0' or '1' only) error signal in register 732 that indicates that the input values are either in or out of the specified range, a more granular, multi-bit error signal could be provided that specifies which range outside the specified range the input values fall into. That would allow the correct additional fixed-point block, or the full floating-point block, as may be required, to be selected directly upon occurrence of the initial error, rather than having to step through each additional block until no error occurs.

Another form of profiling that may be used to direct "speculative" configuration is control flow profiling. Specifically, analysis of the control flow that is to be converted into hardware in the programmable device may reveal (e.g., via simulations) that certain branches or segments of the control flow may never actually be reached. Therefore, the primary configuration could be created without the logic that otherwise would result from those branches or segments. As in the case of value profiling, a configuration including the logic resulting from those branches or segments could also be created. That configuration would be loaded only on occurrence of an error indicating that the omitted logic was required, while in most cases, the more efficient configuration omitting that logic should be used.

Although the creation of "speculative" configurations as just described could be carried out under the direction of a user, more likely it would be carried out autonomously by a processor in the system, or in a separate programming tool, with the user at most providing the inputs described above from which the system can determine which configurations to "speculatively" create.

Figure 9:
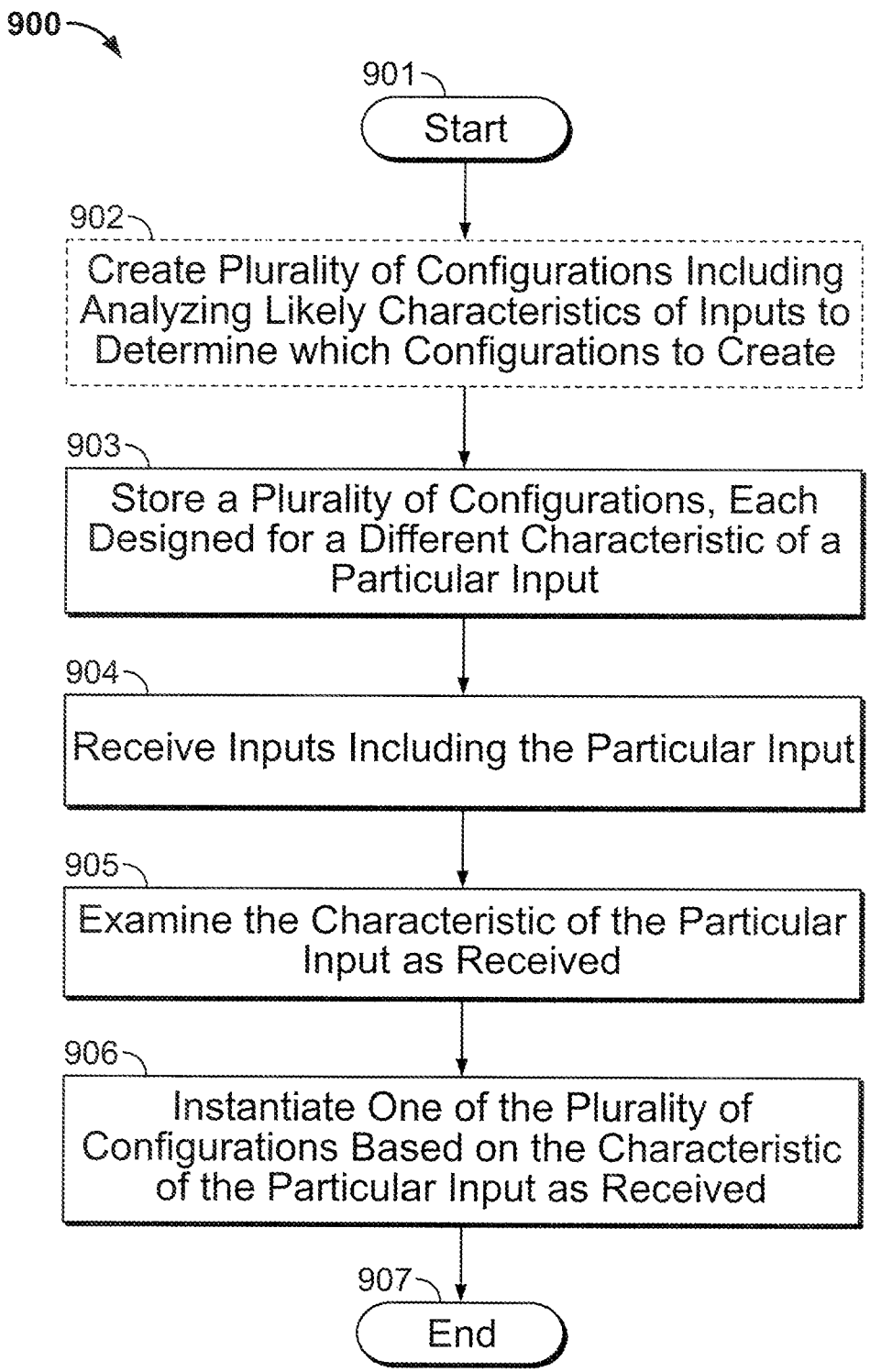
FIG. 9 shows a flow diagram of an example of a method in accordance with embodiments of the present invention.

FIG. 9 shows one possible embodiment 900 of a method according to the present invention for "speculatively" programming or configuring a programmable integrated circuit device. Method 900 starts at 901 and, at 902, which is optional because it may have been previously performed, creates a plurality of configurations, by analyzing likely characteristics of inputs of functions to be programmed or configured, as described above.

Next, at 903, a plurality of configurations, created at 902 or elsewhere, are stored (e.g., in memory 105). At 904, at runtime, inputs, including a particular input of interest, are received. Characteristics of that particular input, as received, are examined at 905. The various types of characteristics that may be considered have been described above.

As a result of the examination at 905, at 906 one of the plurality of configurations that had been stored at 903 is instantiated based on the characteristics of the particular input of interest. Method 900 then ends at 907.

An exemplary implementation of the current invention may be a heterogeneous system such as system 100, running OpenCL, and including the components shown in FIG. 1, such as one or more microprocessors 101, one or more graphics processing units 102, one or more digital signal processing units 103, one or more FPGAs 104 (or similar programmable devices), and one or more memory units 105, all interconnected by an interconnection network or bus 106. Memory units 105 may store various configurations of various function accelerators that may be implemented in an FPGA 104. Those configurations may be created by a configuration tool based on specification by a user of likely inputs to the functions to be accelerated. When system 100 is powered up, one or more FPGAs 104 would be at least partially configured with the various functions. In one embodiment, when a particular function is needed by a microprocessor 101, the microprocessor will cause the relevant FPGA 104 to be partially reconfigured, using well-known FPGA partial reconfiguration techniques, with the correct version of the function in question. The FPGA 104 may be reconfigured or partially reconfigured more than once as the microprocessor 101 calls that function at different times on different inputs.

Thus it is seen that a method for efficiently configuring a programmable integrated circuit device with a function, where the parameters of the function to be configured are passed to the programmable integrated circuit device and are not known until runtime, has been provided.

Instructions for carrying out a method according to this invention for configuring an integrated circuit device may be encoded on a non-transitory machine-readable memory medium (e.g., a magnetic disk, a nonvolatile RAM, or an optical disk such as a CD-ROM or DVD-ROM), to be executed by a suitable computer or similar device to implement the method of the invention for programming or configuring PLDs or other devices with a configuration described by a high-level synthesis language as described above. For example, a personal computer may be equipped with an interface to which a PLD can be connected, and the personal computer can be used by a user to program the PLD using suitable software tools as described above.

Figure 10:
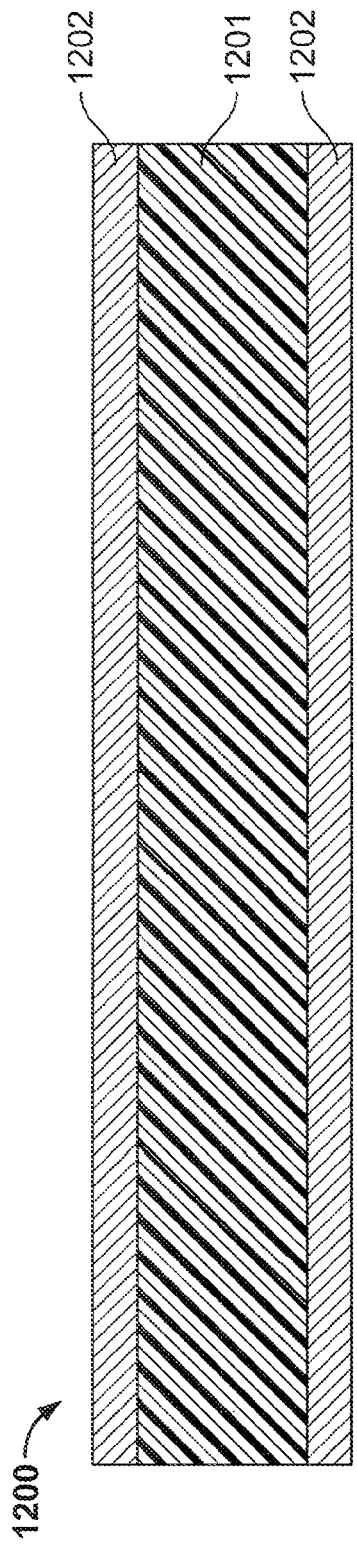
FIG. 10 is a cross-sectional view of a magnetic data storage medium encoded with a set of machine-executable instructions for performing the method according to the present invention.

FIG. 10 presents a cross section of a magnetic data storage medium 1200 which can be encoded with a machine executable program that can be carried out by systems such as the aforementioned personal computer, or other computer or similar device. Medium 1200 can be a floppy diskette or hard disk, or magnetic tape, having a suitable substrate 1201, which may be conventional, and a suitable coating 1202, which may be conventional, on one or both sides, containing magnetic domains (not visible) whose polarity or orientation can be altered magnetically. Except in the case where it is magnetic tape, medium 1200 may also have an opening (not shown) for receiving the spindle of a disk drive or other data storage device.

The magnetic domains of coating 1202 of medium 1200 are polarized or oriented so as to encode, in manner which may be conventional, a machine-executable program, for execution by a programming system such as a personal computer or other computer or similar system, having a socket or peripheral attachment into which the PLD to be programmed may be inserted, to configure appropriate portions of the PLD, including its specialized processing blocks, if any, in accordance with the invention.

Figure 11:
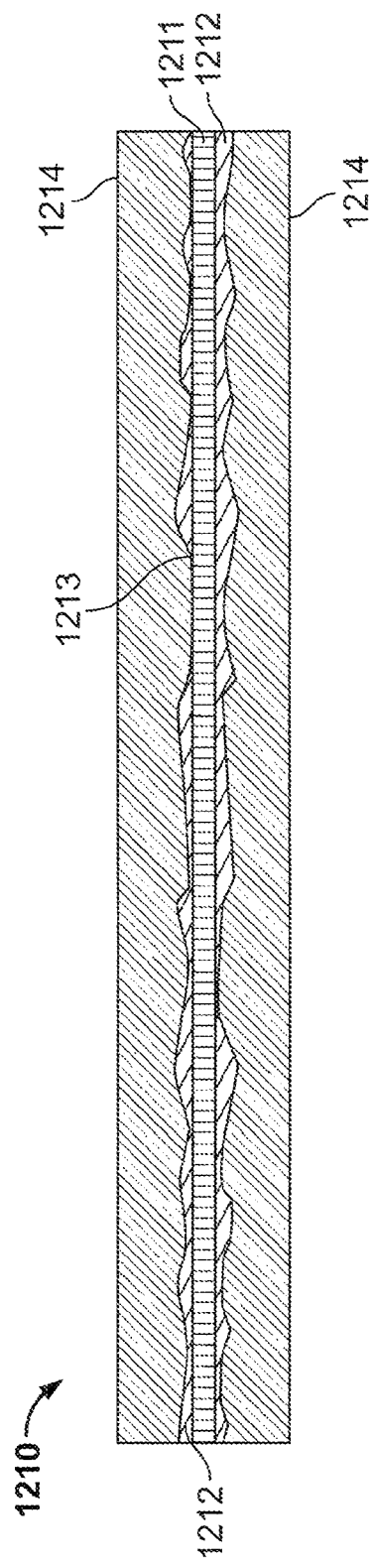
FIG. 11 is a cross-sectional view of an optically readable data storage medium encoded with a set of machine executable instructions for performing the method according to the present invention.

FIG. 11 shows a cross section of an optically-readable data storage medium 1210 which also can be encoded with such a machine-executable program, which can be carried out by systems such as the aforementioned personal computer, or other computer or similar device. Medium 1210 can be a conventional compact disk read-only memory (CD-ROM) or digital video disk read-only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 1210 preferably has a suitable substrate 1211, which may be conventional, and a suitable coating 1212, which may be conventional, usually on one or both sides of substrate 1211.

In the case of a CD-based or DVD-based medium, as is well known, coating 1212 is reflective and is impressed with a plurality of pits 1213, arranged on one or more layers, to encode the machine-executable program. The arrangement of pits is read by reflecting laser light off the surface of coating 1212. A protective coating 1214, which preferably is substantially transparent, is provided on top of coating 1212.

In the case of magneto-optical disk, as is well known, coating 1212 has no pits 1213, but has a plurality of magnetic domains whose polarity or orientation can be changed magnetically when heated above a certain temperature, as by a laser (not shown). The orientation of the domains can be read by measuring the polarization of laser light reflected from coating 1212. The arrangement of the domains encodes the program as described above.

Figure 12:
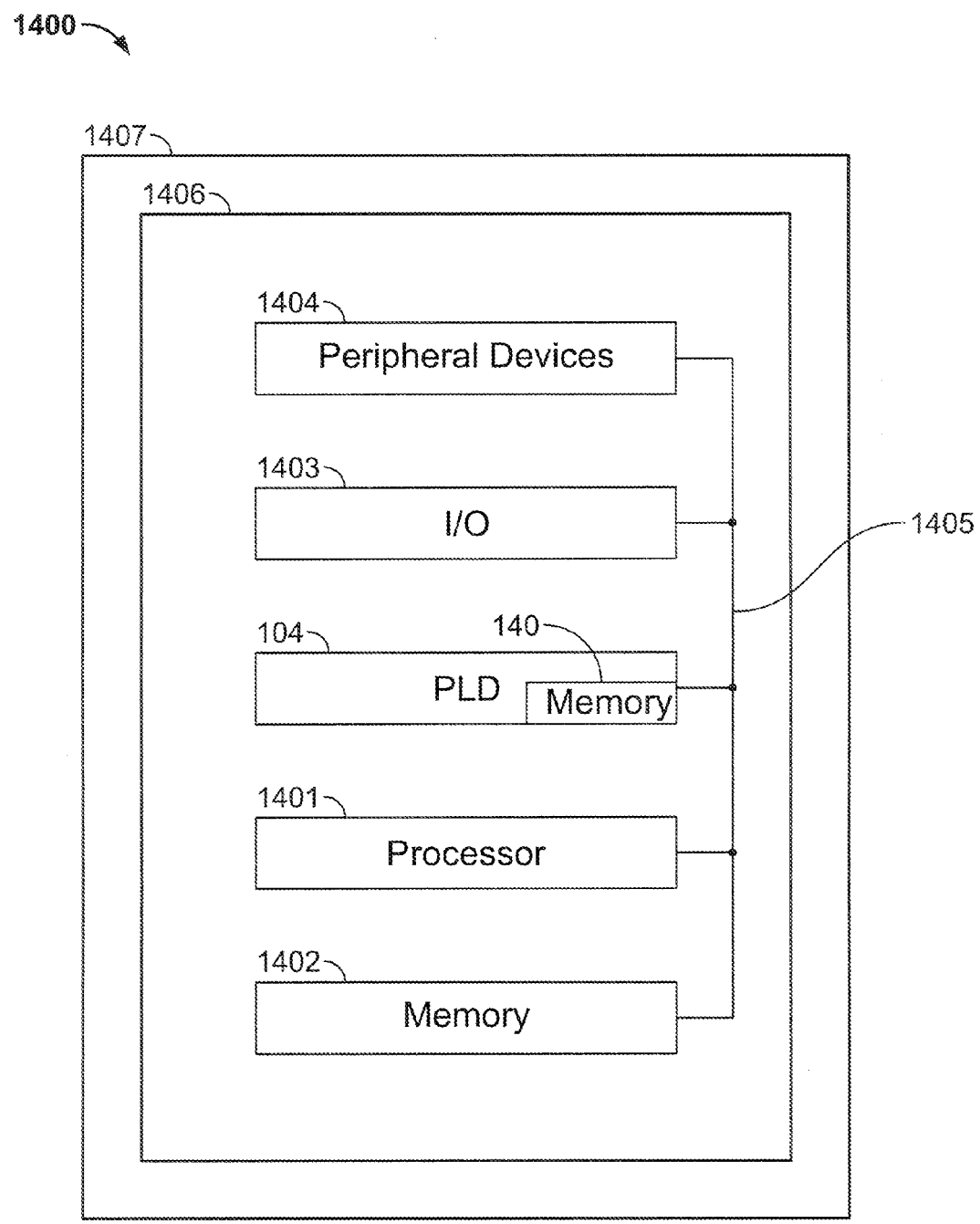
FIG. 12 is a simplified block diagram of an illustrative system employing a programmable logic device incorporating the present invention.

A PLD 104 programmed according to the present invention may be used in many kinds of electronic devices. One possible use is in a data processing system 1400 shown in FIG. 12. Data processing system 1400 may include one or more of the following components: a processor 1401; memory 1402; I/O circuitry 1403; and peripheral devices 1404. These components are coupled together by a system bus 1405 and are populated on a circuit board 1406 which is contained in an end-user system 1407.

System 1400 can be used in a wide variety of applications, such as computer networking, data networking, instrumentation, video processing, digital signal processing, or any other application where the advantage of using programmable or reprogrammable logic is desirable. PLD 140 can be used to perform a variety of different logic functions. For example, PLD 104 can be configured as a processor or controller that works in cooperation with processor 1401. PLD 104 may also be used as an arbiter for arbitrating access to a shared resources in system 1400. In yet another example, PLD 104 can be configured as an interface between processor 1401 and one of the other components in system 1400. It should be noted that system 1400 is only exemplary, and that the true scope and spirit of the invention should be indicated by the following claims.

Various technologies can be used to implement PLDs 104 as described above and incorporating this invention.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:
1. A method of configuring an integrated circuit device to perform a function, the method comprising:
   storing, in memory associated with a processor, a plurality of configurations of the function, each of the configurations based at least in part on a different value or a different range of values of an input to the function;
   receiving, at the processor, the input to the function;

determining, by the processor, one or more values of the input;

selecting, by the processor, a configuration of the plurality of configurations to instantiate based at least in part on the one or more values of the input;

instantiating, by the processor, the selected configuration on the integrated circuit device; and using, by the integrated circuit device, the selected configuration of the function to operate on the input.

2. The method of claim 1 wherein:

the input comprises one or more parameters of the function; and the one or more values comprises one or more respective values of at least one of the one or more parameters.

3. The method of claim 2, wherein the one or more values is associated with a variable loop bound in the function, wherein the method comprises the processor unrolling the variable loop bound, wherein a set of configurations of the plurality of configurations are based at least in part on different values associated with the unrolled variable loop bound.

4. The method of claim 2, wherein the one or more values is associated with a branch condition in the function.

5. The method of claim 1 wherein:

each of the configurations are based at least in part on the different range of values of the input to the function; and the one or more values comprises a range of values to be operated on by the function.

6. The method of claim 1, further comprising creating a plurality of configurations for performing the function, comprising analyzing likely states of the characteristic to determine which of the plurality of configurations to create.

7. The method of claim 6, wherein one of the configurations of the plurality of configurations corresponds to an arbitrary state of the characteristic.

8. The method of claim 6, wherein creating the plurality of configurations is performed autonomously by a processor.

9. A non-transitory machine readable storage medium encoded with instructions for performing a method of configuring an integrated circuit device to perform a function, the instructions comprising:

instructions to create a plurality of configurations of the function, each of the configurations based at least in part on a different value or a different range of values of an input to the function;

instructions to accept the input to the function;

instructions to determine one or more values of the input as received;

instructions to select a configuration of the plurality of configurations to instantiate based at least in part on the one or more values of the input;

instructions to instantiate the selected configuration; and instructions to use the selected configuration of the function to operate on the input.

10. The non-transitory machine readable storage medium of claim 9, wherein the instructions to create the plurality of configurations for performing the function comprise instructions to create a configuration corresponding to an arbitrary state of the characteristic.

11. A system comprising:

a processor;

a programmable integrated circuit device in communication with the processor for performing a function under command of the processor; and memory storing a plurality of configurations of the function, each of the configurations based at least in part on a different value of an input to the function;

wherein the processor:

sends the input to the function to the programmable integrated circuit device;

determines a value of the input;

selects a configuration of the plurality of configurations to instantiate based at least in part on the value of the input; and instantiates the selected configuration on the programmable integrated circuit device; wherein the programmable integrated circuit device uses the selected configuration of the function to operate on the input.

12. The system of claim 11 wherein:

the input comprises one or more parameters of the function; and the value comprises a respective value of at least one of the one or more parameters.

13. The system of claim 12, wherein the value is associated with a variable loop bound in the function, wherein the method comprises the processor unrolling the variable loop bound; wherein a set of configurations of the plurality of configurations are based at least in part on different values for the unrolled variable loop bound.

14. The system of claim 12, wherein the value is associated with a branch condition in the function.

15. The system of claim 11, wherein one of the configurations of the plurality of configurations corresponds to an arbitrary state of the characteristic.

16. The system of claim 11, wherein the memory is part of the programmable integrated circuit device.

17. The system of claim 11, wherein the memory is separate from the programmable integrated circuit device.

18. The system of claim 11, wherein the processor runs under control of a program written in OpenCL.

19. The system of claim 11, wherein the plurality of configurations is created autonomously by the processor.

20. The system of claim 11, wherein the plurality of configurations is created autonomously by an external programming tool.

21. A programmable integrated circuit device comprising:

programmable logic circuitry communicatively coupled to a processor;

memory storing a plurality of configurations of the programmable logic circuitry for performing a function, each of the configurations of the plurality of configurations based at least in part on a different range of values of an input to the function;

wherein the processor selects a configuration of the plurality of configurations to instantiate based at least in part on a range of values of the input, the processor instantiates the selected configuration, and the programmable logic circuitry uses the selected configuration of the function to operate on the input.

22. The programmable integrated circuit device of claim 21 wherein:

the input comprises one or more parameters of the function; and the range of values comprises a range of respective values of at least one of the one or more parameters.

23. The programmable integrated circuit device of claim 22, wherein the range of values is associated with a variable loop bound in the function, wherein the method comprises the processor unrolling the variable loop bound; wherein a set of configurations of the plurality of configurations are designed based at least in part on different ranges of values for the unrolled variable loop bound.

24. The programmable integrated circuit device of claim 22, wherein the range of values is associated with a branch condition in the function.

25. The programmable integrated circuit device of claim 21, wherein one of the configurations of the plurality of configurations corresponds to an arbitrary state of the characteristic.

26. The programmable integrated circuit device of claim 21, wherein the plurality of configurations is created autonomously by an external programming tool.

* * * * *